(12) United States Patent
Takahashi et al.

(10) Patent No.: US 9,206,336 B2
(45) Date of Patent: Dec. 8, 2015

(54) POLISHING COMPOSITION, MANUFACTURING PROCESS THEREFOR, PROCESS FOR PRODUCTION OF SILICON SUBSTRATE, AND SILICON SUBSTRATE

(71) Applicant: FUJIMI INCORPORATED, Kiyosu-shi, Aichi (JP)

(72) Inventors: Shuhei Takahashi, Kiyosu (JP); Kohsuke Tsuchiya, Kiyosu (JP); Shinichiro Takami, Kiyosu (JP); Yoshio Mori, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/372,141

(22) PCT Filed: Jan. 16, 2013

(86) PCT No.: PCT/JP2013/050654
§ 371 (c)(1),
(2) Date: Jul. 14, 2014

(87) PCT Pub. No.: WO2013/108777
PCT Pub. Date: Jul. 25, 2013

(65) Prior Publication Data
US 2015/0056122 A1  Feb. 26, 2015

(30) Foreign Application Priority Data

Jan. 16, 2012  (JP) ................. 2012-006371

(51) Int. Cl.
| | |
|---|---|
| *C09G 1/00* | (2006.01) |
| *C09G 1/02* | (2006.01) |
| *C09K 3/14* | (2006.01) |
| *C09G 1/04* | (2006.01) |
| *H01L 21/02* | (2006.01) |
| *C01B 33/02* | (2006.01) |
| *B24B 37/04* | (2012.01) |

(52) U.S. Cl.
CPC ................ *C09G 1/02* (2013.01); *B24B 37/044* (2013.01); *C01B 33/02* (2013.01); *C09G 1/04* (2013.01); *C09K 3/1409* (2013.01); *C09K 3/1463* (2013.01); *H01L 21/02024* (2013.01)

(58) Field of Classification Search
None
See application file for complete search history.

(56) References Cited

U.S. PATENT DOCUMENTS

| | | | |
|---|---|---|---|
| 6,280,300 B1* | 8/2001 | Komatsu et al. ................ 451/87 |
| 6,685,757 B2 | 2/2004 | Xu et al. | |
| 6,929,532 B1* | 8/2005 | Seaman ......................... 451/36 |
| 7,775,854 B1* | 8/2010 | Boman et al. .................... 451/8 |
| 2003/0154659 A1 | 8/2003 | Xu et al. | |
| 2006/0030243 A1 | 2/2006 | Nishimoto et al. | |
| 2006/0032150 A1 | 2/2006 | So et al. | |
| 2007/0059935 A1 | 3/2007 | Kozasa et al. | |
| 2010/0190413 A1 | 7/2010 | Nishimoto et al. | |

FOREIGN PATENT DOCUMENTS

| | | |
|---|---|---|
| JP | 2000-218107 A | 8/2000 |
| JP | 2001-015461 A | 1/2001 |
| JP | 2001-294417 A | 10/2001 |
| JP | 2003-136406 A | 5/2003 |
| JP | 2005-518668 A | 6/2005 |
| JP | 2006-056774 A | 3/2006 |
| JP | 2006-136996 A | 6/2006 |
| JP | 2007-073686 A | 3/2007 |
| JP | 2007-073687 A | 3/2007 |
| JP | 4772156 B1 | 7/2011 |
| WO | WO 03/072669 A2 | 9/2003 |

OTHER PUBLICATIONS

Translation of Tanaka JP2003-136406.*

* cited by examiner

*Primary Examiner* — Duy Deo
(74) *Attorney, Agent, or Firm* — Foley & Lardner LLP

(57) ABSTRACT

A polishing composition is composed of a filtered diluted liquid obtained through an undiluted liquid-preparing step, an undiluted liquid-filtering step, a diluting step, and a diluted liquid-filtering step. In the undiluted liquid-preparing step, an undiluted liquid is prepared by mixing raw materials for the polishing composition. In the undiluted liquid-filtering step, the undiluted liquid is filtered. In the diluting step, the filtered undiluted liquid is diluted to obtain a diluted liquid. In the diluted liquid-filtering step, the diluted liquid is filtered. The polishing composition is used, for example, for polishing a silicon substrate material to produce a silicon substrate.

4 Claims, No Drawings

POLISHING COMPOSITION, MANUFACTURING PROCESS THEREFOR, PROCESS FOR PRODUCTION OF SILICON SUBSTRATE, AND SILICON SUBSTRATE

TECHNICAL FIELD

The present invention relates to a polishing composition, a method for producing the same, a silicon substrate production method using the polishing composition, and a silicon substrate produced by using the polishing composition.

BACKGROUND ART

A polishing composition containing abrasive grains is used for polishing, for example, a silicon substrate (see Patent document 1). In order to stabilize the quality of a polished product obtained by polishing an object, it is important to reduce aggregates in a polishing composition. In this regard, Patent document 2 discloses a technique for enhancing the dispersibility of abrasive grains. Patent document 3 discloses a technique in which a specific polymer compound is added to a concentrated liquid of a polishing composition to improve the storage stability of the concentrated liquid.

PRIOR ART DOCUMENTS

Patent document 1: Japanese National Phase Laid-Open Patent Publication No. 2005-518668
Patent document 2: Japanese Laid-Open Patent Publication No. 2001-15461
Patent document 3: Japanese Patent No. 4772156

SUMMARY OF THE INVENTION

Problems that the Invention is to Solve

As described above, the formation of aggregates in a polishing composition can be suppressed by, for example, blending a dispersant. However, there is still a room to make further improvements to enhance the quality of a polished product.

Accordingly, it is an objective of the present invention to provide a polishing composition useful for producing a high-quality polished product, and a method for producing the same. It is another objective of the present invention to provide a silicon substrate production method capable of easily obtaining a high-quality silicon substrate, and a high-quality silicon substrate.

Means for Solving the Problems

In order to achieve the objectives described above and in accordance with a first aspect of the present invention, provided is a polishing composition composed of a filtered diluted liquid that is obtained through: preparing an undiluted liquid by mixing raw materials for the polishing composition; filtering the undiluted liquid; diluting the filtered undiluted liquid to obtain a diluted liquid; and filtering the diluted liquid.

In accordance with a second aspect of the present invention, provided is a polishing composition composed of a filtered diluted liquid that is obtained through: filtering at least part of raw materials for the polishing composition; preparing an undiluted liquid by mixing the raw materials at least part of which are filtered; diluting the undiluted liquid to obtain a diluted liquid; and filtering the diluted liquid.

The raw materials preferably include abrasive grains, a water-soluble polymer, and water. More preferably, the raw materials further include a basic compound.

The polishing compositions of the first and second aspects described above are preferably used for polishing a silicon substrate material.

In accordance with a third aspect of the present invention, a method for producing a polishing composition is provided that includes: preparing an undiluted liquid by mixing raw materials for the polishing composition; filtering the undiluted liquid; diluting the filtered undiluted liquid to obtain a diluted liquid; and filtering the diluted liquid.

In accordance with a fourth aspect of the present invention, a method for producing a polishing composition is provided that includes: filtering at least part of raw materials for the polishing composition; preparing an undiluted liquid by mixing the raw materials at least part of which are filtered; diluting the undiluted liquid to obtain a diluted liquid; and filtering the diluted liquid.

In accordance with a fifth aspect of the present invention, a method for producing a silicon substrate is provided that includes polishing a silicon substrate material with the polishing composition according to the first or second aspect described above.

In accordance with a sixth aspect of the present invention, a silicon substrate is provided that is obtained by polishing a silicon substrate material with the polishing composition according to the first or second aspect described above.

Effects of the Invention

The present invention succeeds in easily providing a high-quality polished product, such as a silicon substrate.

MODES FOR CARRYING OUT THE INVENTION

First Embodiment

Hereinafter, a first embodiment of the present invention will be described.

A polishing composition according to the present embodiment is produced by a method including an undiluted liquid-preparing step, an undiluted liquid-filtering step, a diluting step, and a diluted liquid-filtering step.

In the undiluted liquid-preparing step, an undiluted liquid is prepared by mixing raw materials for the polishing composition. In the undiluted liquid-filtering step, the undiluted liquid is filtered. In the diluting step, the filtered undiluted liquid is diluted to obtain a diluted liquid. In the diluted liquid-filtering step, the diluted liquid is filtered. The polishing composition is composed of a filtrate obtained in the diluted liquid-filtering step, i.e., the filtered diluted liquid. The polishing composition is used for polishing a silicon substrate material.

The raw materials for the polishing composition include, for example, abrasive grains, a water-soluble polymer, a basic compound, and water.

The abrasive grains function to mechanically polish a surface to be polished. Specific examples of the abrasive grains include particles made of metal oxide, such as silica, alumina, ceria, zirconia, and titania; silicon carbide particles; calcium carbonate particles; and diamond particles. The abrasive grains may be used by one kind alone or in combination of two or more kinds. The abrasive grains are preferably silica particles. Examples of the silica particles include colloidal silica and fumed silica. Among them, colloidal silica is preferable. When colloidal silica or fumed silica is used, particularly when colloidal silica is used, scratches to be formed on the surface of a silicon substrate by polishing with the polishing composition is reduced.

The average primary particle diameter of the abrasive grains is preferably 5 nm or more, more preferably 10 nm or more, and still more preferably 20 nm or more. As the average primary particle diameter of the abrasive grains increases, the polishing rate of a silicon substrate is improved.

The average primary particle diameter of the abrasive grains is also preferably 100 nm or less, more preferably 50 nm or less, and still more preferably 40 nm or less. As the average primary particle diameter of the abrasive grains decreases, the dispersion stability of the polishing composition is improved.

The average primary particle diameter of the abrasive grains is calculated, for example, from the specific surface area of the abrasive grains determined by the BET method. The specific surface area of the abrasive grains can be determined, for example, by using "Flow SorbII 2300", manufactured by Micromeritics Instrument Corporation.

The content of the abrasive grains in the polishing composition is preferably 0.01% by mass or more. As the content of the abrasive grains increases, surface processing properties such as a polishing rate of the surface to be polished are improved.

The content of the abrasive grains in the polishing composition is also preferably 5% by mass or less, more preferably 1% by mass or less, and still more preferably 0.5% by mass or less. As the content of the abrasive grains decreases, the dispersion stability of the polishing composition is improved, and the residue of the abrasive grains on a polished surface tends to be reduced.

The water-soluble polymer functions to enhance the wettability of a surface to be polished. A water-soluble polymer having at least one functional group selected from a cation group, an anion group, and a nonionic group in the molecule can be used. A water-soluble polymer to be used may contain a hydroxyl group, a carboxyl group, an acyloxy group, a sulfo group, a quaternary nitrogen structure, a heterocyclic structure, a vinyl structure, or a polyoxy alkylene structure in the molecule.

Specific examples of a water-soluble polymer include a cellulose derivative; an imine derivative, such as poly(N-acyl alkylene imine); polyvinyl alcohol; polyvinyl pyrrolidone; a copolymer containing polyvinyl pyrrolidone in a part of the structure; polyvinyl caprolactam; a copolymer containing polyvinyl caprolactam in a part of the structure; polyoxyethylene; a polymer having a polyoxy alkylene structure; a polymer having a multiple structure such as a diblock type, triblock type, random type, and alternate type thereof; and a polyether-modified silicone.

The water-soluble polymers may be used by one kind alone or in combination of two or more kinds.

A water-soluble polymer to be used is preferably a cellulose derivative, polyvinyl pyrrolidone, or a polymer having a polyoxy alkylene structure, since they have a good function of imparting hydrophilic properties. Specific examples of a cellulose derivative include hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose, and carboxymethyl cellulose. Among the cellulose derivatives, hydroxyethyl cellulose is preferable from the viewpoints of having high ability to impart wettability to a polished surface and providing ease of washing off.

The weight average molecular weight of the water-soluble polymer is preferably 300 or more, more preferably 1,000 or more, still more preferably 10,000 or more, yet still more preferably 100,000 or more, and most preferably 200,000 or more, in terms of polyethylene oxide. As the weight average molecular weight of the water-soluble polymer increases, the hydrophilic properties of a surface to be polished tend to be enhanced.

The weight average molecular weight of the water-soluble polymer is also preferably less than 2,000,000, more preferably less than 1,500,000, still more preferably less than 1,000,000, and most preferably less than 500,000. As the weight average molecular weight of the water-soluble polymer decreases, the stability of the polishing composition is further improved.

The content of the water-soluble polymer in the polishing composition is preferably 0.002% by mass or more, more preferably 0.004% by mass or more, and still more preferably 0.006% by mass or more. As the content of the water-soluble polymer in the polishing composition increases, the wettability of a surface to be polished tends to be further enhanced.

The content of the water-soluble polymer in the polishing composition is also preferably 0.5% by mass or less, more preferably 0.2% by mass or less, and still more preferably 0.1% by mass or less. As the content of the water-soluble polymer in the polishing composition decreases, the dispersion stability of the polishing composition tends to be easily improved.

The basic compound functions to chemically polish a surface to be polished, and to improve the dispersion stability of the polishing composition.

Specific examples of a basic compound to be used include a hydroxide or salt of an alkali metal, a quaternary ammonium hydroxide or a salt thereof, ammonia, and an amine. Specific examples of an alkali metal include potassium and sodium. Specific examples of a salt include a carbonate, hydrogen carbonate, sulfate, and acetate. Specific examples of a quaternary ammonium include tetramethylammonium, tetraethylammonium, and tetrabutylammonium. Specific examples of a hydroxide or salt of an alkali metal include potassium hydroxide, potassium carbonate, potassium hydrogen carbonate, potassium sulfate, potassium acetate, and potassium chloride. Specific examples of a quaternary ammonium hydroxide or a salt thereof include tetramethylammonium hydroxide, tetraethylammonium hydroxide, and tetrabutylammonium hydroxide. Specific examples of an amine include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methylpiperazine, and guanidine. The basic compounds may be used by one kind alone or in combination of two or more kinds.

A basic compound to be used is preferably at least one selected from ammonia, an ammonium salt, an alkali metal hydroxide, an alkali metal salt, and a quaternary ammonium hydroxide. Among them, a basic compound to be used is preferably at least one selected from ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, and sodium carbonate, more preferably at least one selected from ammonia, potassium hydroxide, sodium hydroxide, tetramethylammonium hydroxide, and tetraethylammonium hydroxide, still more preferably at least one of ammonia and tetramethylammonium hydroxide, and most preferably ammonia.

The content of the basic compound in the polishing composition is preferably 0.001% by mass or more, more preferably 0.002% by mass or more, and still more preferably 0.003% by mass or more. As the content of the basic compound in the polishing composition increases, the function of chemically polishing a surface to be polished, and the function of improving the dispersion stability of the polishing composition tend to be enhanced.

The content of the basic compound in the polishing composition is also preferably 1.0% by mass or less, more preferably 0.5% by mass or less, and still more preferably 0.2% by mass or less. As the content of the basic compound in the polishing composition decreases, the smoothness of a polished surface tends to be improved.

Water serves as a dispersion medium or a solvent for other components in the polishing composition. For example, water in which the total content of transition metal ions is 100 ppb or less is preferably used in order to avoid as much as possible the actions of the other components from being inhibited. The purity of water can be enhanced by an operation such as removal of impurity ions using an ion-exchange resin, removal of foreign matters using a filter, and distillation. Specifically, ion-exchange water, pure water, ultrapure water, or distilled water is preferably used.

The pH of the polishing composition is preferably within the range of 8 to 12, and more preferably within the range of 9 to 11. When the pH of the polishing composition is within the range of 8 to 12, a preferable polishing rate is easily achieved in practice.

The raw materials for the polishing composition may further include a surfactant, an organic acid, an organic acid salt, an inorganic acid, an inorganic acid salt, or a chelating agent, for example.

The surfactant functions to suppress the roughness of a polished surface. This easily reduces the haze level of the polished surface. Particularly, when the polishing composition contains a basic compound, roughness due to the chemical etching of the basic compound is likely to be caused on a polished surface, and therefore the use of a surfactant in combination with a basic compound is effective in suppressing the roughness.

The weight average molecular weight of a surfactant to be used may be less than 300. The surfactant may be an ionic surfactant or a nonionic surfactant, and among them, a nonionic surfactant is suitably used. Since a nonionic surfactant has low foamability, the handling of the polishing composition during preparation and use is facilitated. Also, the pH adjustment of the polishing composition when the nonionic surfactant is used is easier than that when the ionic surfactant is used.

Specific examples of a nonionic surfactant include oxyalkylene polymers, such as polyethylene glycol and polypropylene glycol; and polyoxyalkylene adducts, such as polyoxyethylene alkyl ether, polyoxyethylene alkyl phenyl ether, polyoxyethylene alkylamine, polyoxyethylene fatty acid ester, polyoxyethylene glycel ether fatty acid ester, and polyoxyethylene sorbitan fatty acid ester. More specific examples thereof include a polyoxyethylene polyoxypropylene copolymer, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octylphenyl ether, polyoxyethylene nonylphenyl ether, polyoxyethylene dodecylphenyl ether, polyoxyethylene styrenated phenyl ether, polyoxyethylene laurylamine, polyoxyethylene stearylamine, polyoxyethylene oleylamine, polyoxyethylene stearylamide, polyoxyethylene oleylamide, polyoxyethylene monolaurate ester, polyoxyethylene monostearate ester, polyoxyethylene distearate ester, polyoxyethylene monooleate ester, polyoxyethylene dioleate ester, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitol tetraoleate, polyoxyethylene castor oil, and polyoxyethylene hydrogenated castor oil.

The surfactants may be used by one kind alone or in combination of two or more kinds.

The organic acid and the salt thereof, and the inorganic acid and the salt thereof function to improve the hydrophilic properties of a polished surface.

Specific examples of an organic acid to be used include fatty acids, such as formic acid, acetic acid, and propionic acid; aromatic carboxylic acids, such as benzoic acid and phthalic acid; citric acid; oxalic acid; tartaric acid; malic acid; maleic acid; fumaric acid; succinic acid; organic sulfonic acids; and organic phosphonic acids. Specific examples of an organic acid salt to be used include alkali metal salts, such as a sodium salt and potassium salt, of the organic acids, or ammonium salts thereof.

Specific examples of an inorganic acid to be used include sulfuric acid, nitric acid, hydrochloric acid, and carbonic acid. Specific examples of an inorganic acid salt to be used include alkali metal salts, such as a sodium salt and potassium salt, of the inorganic acids, or ammonium salts thereof.

Among the organic acid salts and the inorganic acid salts, an ammonium salt is preferable from the viewpoint of suppressing the metal contamination of a polished product.

The organic acids and the salts thereof, and the inorganic acids and the salts thereof may be used by one kind alone or in combination of two or more kinds.

The chelating agent functions to suppress the metal contamination of a polished product. Specific examples of a chelating agent to be used include an aminocarboxylic acid chelating agent and an organic phosphonic acid chelating agent. Specific examples of an aminocarboxylic acid chelating agent include ethylenediaminetetraacetic acid, sodium ethylenediaminetetraacetate, nitrilotriacetic acid, sodium nitrilotriacetate, ammonium nitrilotriacetate, hydroxyethyl ethylenediaminetriacetic acid, sodium hydroxyethyl ethylenediaminetriacetate, diethylenetriaminepentaacetic acid, sodium diethylenetriaminepentaacetate, triethylenetetraaminehexaacetic acid, and sodium triethylenetetraminehexaacetate. Specific examples of an organic phosphonic acid chelating agent include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta (methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxy phosphonic acid, 2-phosphonobutane-1,2-dicarboxylic acid, 1-phosphonobutane-2,3,4-tricarboxylic acid, and α-methyl phosphonosuccinic acid.

A well-known mixing apparatus such as a blade-type stirrer, an ultrasonic disperser, and a homomixer can be used to mix the raw materials in the undiluted liquid-preparing step. All the raw materials may be simultaneously mixed or may be mixed in no particular order.

Next, the undiluted liquid-filtering step, the diluting step, and the diluted liquid-filtering step will be described.

A first filter is used in the undiluted liquid-filtering step, and a second filter is used in the diluted liquid-filtering step. Hereinafter, conditions such as the aperture and material of each filter, and the ratio of the apertures of the first and second filters will be described. However, these conditions may be appropriately changed depending on the relationship between the filtration rate and the quality of a polished silicon substrate. That is, the present invention is not restricted by the following conditions.

The undiluted liquid-filtering step is performed mainly for the purpose of removing foreign matters contained in the raw materials for the polishing composition and foreign matters mixed in the process of preparing the undiluted liquid of the polishing composition. The filtration in the undiluted liquid-filtering step may be natural filtration, which is performed under the normal pressure, suction filtration, pressure filtration, or centrifugal filtration.

The first filter used in the undiluted liquid-filtering step is preferably selected on the basis of the aperture. The aperture A1 of the first filter is preferably 0.05 μm or more, and more preferably 0.1 μm or more. As the aperture A1 increases, a practical filtration rate is easily obtained.

The aperture A1 of the first filter is preferably 50 μm or less, more preferably 5 μm or less, and still more preferably 0.3 μm or less. As the aperture A1 decreases, a polishing composition useful for producing a high-quality silicon substrate is more easily obtained.

The aperture of the filter is announced as a nominal aperture by a filter maker.

The filtration rate R1 in the undiluted liquid-filtering step is preferably 0.005 mL/(minute·mm$^2$) or more, more preferably 0.010 mL/(minute·mm$^2$) or more, and still more preferably 0.015 mL/(minute·mm$^2$) or more, at a suction pressure of 50 kPa. As the filtration rate R1 increases, the efficiency of the undiluted liquid-filtering step is improved.

The filtration rate R1 in the undiluted liquid-filtering step is also preferably 10 mL/(minute·mm$^2$) or less, more preferably 8 mL/(minute·mm$^2$) or less, and still more preferably 5 mL/(minute·mm$^2$) or less, at a suction pressure of 50 kPa. As the filtration rate R1 decreases, the removal efficiency of the foreign matters is enhanced, as a result of which a polishing composition useful for producing a high-quality silicon substrate is more easily obtained.

The filtration capacity V1 of the first filter, which is the amount of the undiluted liquid passing through the first filter before the first filter is clogged after the supply of the undiluted liquid to the first filter is started, is preferably 0.1 mL/mm$^2$ or more, more preferably 0.2 mL/mm$^2$ or more, and still more preferably 0.5 mL/mm$^2$ or more. As the filtration capacity V1 of the first filter increases, the running cost of the undiluted liquid-filtering step can be reduced.

The filtration capacity V1 of the first filter is also preferably 100 mL/mm$^2$ or less, more preferably 50 mL/mm$^2$ or less, and still more preferably 20 mL/mm$^2$ or less. As the filtration capacity V1 of the first filter decreases, the removal efficiency of the foreign matters is enhanced, as a result of which the efficiency of the undiluted liquid-filtering step is improved.

The clogging of the first filter as used herein refers to a state where the undiluted liquid cannot be substantially filtered due to a large amount of the foreign matters or the like caught on the filter, more specifically, a state where the filtration rate R1 at a suction pressure of 50 kPa is 0.005 mL/(minute·mm$^2$) or less.

A filtrate obtained through the undiluted liquid-filtering step, i.e., the filtered undiluted liquid is then subjected to the diluting step.

Water used for diluting the filtered undiluted liquid in the diluting step may be any one previously described as water capable of being used as the raw materials for the polishing composition. The filtered undiluted liquid is preferably diluted by a method including gradually adding water to the filtered undiluted liquid while stirring the filtered undiluted liquid in the mixing apparatus described above. Alternatively, the method including adding water to the filtered undiluted liquid and then stirring them using the mixing apparatus may be performed.

The dilution ratio D in the diluting step is preferably 2 times or more, more preferably 5 times or more, and still more preferably 10 times or more, in terms of volume. As the dilution ratio D increases, the transportation cost of the undiluted liquid can be reduced, and the space required for storing the undiluted liquid can be reduced.

The dilution ratio D in the diluting step is also preferably 100 times or less, more preferably 50 times or less, and still more preferably 30 times or less, in terms of volume. As the dilution ratio D decreases, the stability of the diluted liquid obtained after dilution and the stability of the polishing composition obtained by filtering the diluted liquid are easily secured.

The diluted liquid obtained by diluting the filtered undiluted liquid is then subjected to the diluted liquid-filtering step. The diluted liquid-filtering step is performed for the purpose of removing foreign matters or aggregates contained in the diluted liquid. The filtration in the diluted liquid-filtering step may be natural filtration, which is performed under the normal pressure, suction filtration, pressure filtration, or centrifugal filtration.

The second filter used in the diluted liquid-filtering step is preferably selected on the basis of the aperture. The aperture A2 of the second filter is preferably 0.05 μm or more, and more preferably 0.1 μm or more. As the aperture A2 increases, a practical filtration rate is easily obtained.

The aperture A2 of the second filter is preferably 50 μm or less, more preferably 5 μm or less, and still more preferably 0.3 μm or less. As the aperture A2 decreases, a polishing composition useful for producing a high-quality silicon substrate is more easily obtained.

The filtration rate R2 in the diluted liquid-filtering step is preferably 0.005 mL/(minute·mm$^2$) or more, more preferably 0.010 mL/(minute·mm$^2$) or more, and still more preferably 0.015 mL/(minute·mm$^2$) or more, at a suction pressure of 50 kPa. As the filtration rate R2 increases, the efficiency of the diluted liquid-filtering step is improved.

The filtration rate R2 in the diluted liquid-filtering step is also preferably 10 mL/(minute·mm$^2$) or less, more preferably 8 mL/(minute·mm$^2$) or less, and still more preferably 5 mL/(minute·mm$^2$) or less, at a suction pressure of 50 kPa. As the filtration rate R2 decreases, the removal efficiency of the foreign matters is enhanced, as a result of which a polishing composition useful for producing a high-quality silicon substrate is more easily obtained.

The filtration capacity V2 of the second filter, which is the amount of the diluted liquid passing through the second filter before the second filter is clogged after the supply of the diluted liquid to the second filter is started, is preferably 0.1 mL/mm$^2$ or more, more preferably 0.2 mL/mm$^2$ or more, and still more preferably 0.3 mL/mm$^2$ or more. As the filtration capacity V2 of the second filter increases, the running cost of the diluted liquid-filtering step can be reduced.

The filtration capacity V2 of the second filter is also preferably 10 mL/mm² or less, more preferably 8 mL/mm² or less, and still more preferably 5 mL/mm² or less. As the filtration capacity V2 of the second filter decreases, the removal efficiency of the foreign matters is enhanced, as a result of which the efficiency of the diluted liquid-filtering step is improved.

The clogging of the second filter as used herein refers to a state where the diluted liquid cannot be substantially filtered due to a large amount of the foreign matters and aggregates caught on the filter, more specifically, a state where the filtration rate R2 at a suction pressure of 50 kPa is 0.005 mL/(minute·mm²) or less.

The ratio A2/A1 of the aperture A2 of the second filter to the aperture A1 of the first filter is preferably within the range of 0.001 to 1,000, more preferably within the range of 0.005 to 100, and still more preferably within the range of 0.1 to 10. When the ratio A2/A1 is 0.001 or more, the removal efficiency of the foreign matters and aggregates in the diluted liquid-filtering step is enhanced, as a result of which the efficiency of the diluted liquid-filtering step is enhanced. When the ratio A2/A1 is 1,000 or less, the filtration in the diluted liquid-filtering step becomes precise.

The ratio R2/R1 of the filtration rate R2 in the diluted liquid-filtering step to the filtration rate R1 in the undiluted liquid-filtering step is preferably within the range of 0.001 to 1,000, more preferably within the range of 0.005 to 10, and still more preferably within the range of 0.01 to 5. When the ratio R2/R1 is 0.001 or more, the removal efficiency of the foreign matters and aggregates in the diluted liquid-filtering step is enhanced, as a result of which the efficiency of the diluted liquid-filtering step is enhanced. When the ratio R2/R1 is 1,000 or less, the filtration in the diluted liquid-filtering step becomes precise.

The materials of the first and second filters are not particularly limited as long as the materials are suitable for removing particles in a water-based solvent. Specific examples of the materials of the first and second filters include cellulose, nylon, polysulfone, polyether sulfone, polypropylene, polytetrafluoroethylene (PTFE), and polycarbonate. From the viewpoint of filtration precision, nylon, polypropylene, or polyether sulfone is preferable. Furthermore, when the viewpoint of a filter life is also considered, polypropylene is more preferable.

Each of the first filter and the second filter may be a membrane filter or a depth filter. The shape of each of the first and second filters is not particularly limited. For example, the shape may be of a flat membrane form, a pleated form, and a hollow fiber form.

All of the material, type, and shape of the first filter may be the same as those of the second filter. Alternatively, at least any one of the materials, types, and shapes of the first and second filters may be different from each other.

Next, a method for producing a silicon substrate using a polishing composition will be described with the action of the polishing composition.

The polishing composition can be used for a polishing step, such as lapping processing and polishing processing, using as an object to be polished a silicon substrate material cut out from a silicon ingot. Specifically, a polishing pad is pressed against a surface to be polished of the silicon substrate material while the polishing composition is supplied onto the surface, and the silicon substrate material and the polishing pad are rotated.

The polishing composition is composed of a filtered diluted liquid that is obtained through the undiluted liquid-preparing step, the undiluted liquid-filtering step, the diluting step, and the diluted liquid-filtering step as described above. Since the foreign matters contained in the undiluted liquid are reduced in the undiluted liquid-filtering step, aggregates containing as cores the foreign matters in the undiluted liquid are less likely to be formed during the storage, transportation, or dilution of the undiluted liquid. Also, since the foreign matters and aggregates contained in the polishing composition are reduced in the diluted liquid-filtering step, the silicon substrate material and the silicon substrate are less likely to be affected by the foreign matters and aggregates in the polishing composition.

A silicon substrate, which is a polished product, is obtained by rinsing the silicon substrate after the polishing step and then drying the silicon substrate.

The polishing composition of the present embodiment has a particularly-high utility value when the polishing composition contains the abrasive grains, the water-soluble polymer, and water and is used for the final polishing of the silicon substrate material. In the case of such a polishing composition, bridged aggregation between particulate matters, such as the abrasive grains and the foreign matters, in the polishing composition may be caused by the water-soluble polymer. The bridged aggregation is likely to be generated in the diluting step, in which the filtered undiluted liquid is diluted with water. In many cases, the bridged aggregates generated in the diluting step remains without being re-dispersed in the polishing composition. When the bridged aggregates remain on the silicon substrate after the final polishing, surface defects referred to as light point defects (LPDs) may be caused. In this regard, since the polishing composition of the present embodiment is produced through the diluted liquid-filtering step, in which the diluted liquid obtained in the diluting step is filtered, the bridged aggregates can be prevented from remaining on the silicon substrate after the final polishing. Also, since the aggregates in the filtered undiluted liquid is decreased by the undiluted liquid-filtering step, the reducing effect of the aggregates before and after the diluted liquid-filtering step is expected to be synergistically exhibited.

When the polishing composition is used for the final polishing of the silicon substrate material, the number of coarse particles contained in the polishing composition and having a size of 0.7 μm or more is preferably as small as possible. Specifically, the number of the coarse particles of 0.7 μm or more contained in the polishing composition is preferably 2,000 or less per 1 mL, more preferably 1,500 or less per 1 mL, and still more preferably 1,300 or less per 1 mL. The number of the coarse particles in the polishing composition can be reduced in the diluted liquid-filtering step.

The present embodiment described in detail above exhibits the following effects.

(1) The polishing composition of the present embodiment is produced through the process of filtering an undiluted liquid of the polishing composition, diluting the filtered undiluted liquid, and further filtering the undiluted liquid. Since this reduces the foreign matters and aggregates contained in the polishing composition, a polished product produced by using the polishing composition is less likely to be affected by the foreign matters and aggregates in the polishing composition. Therefore, a high-quality polished product is easily obtained.

(2) When the polishing composition of the present embodiment is used for the purpose of polishing the silicon substrate material, a high-quality silicon substrate is easily obtained.

(3) According to the method for producing a polishing composition of the present embodiment, a polishing composition useful for producing a high-quality polished product can be easily obtained through the process of filtering an undiluted liquid, diluting the filtered undiluted liquid, and further filtering the undiluted liquid.

(4) According to the method for producing a silicon substrate that includes polishing a silicon substrate material with the polishing composition of the present embodiment, a high-quality silicon substrate can be easily obtained.

(5) The silicon substrate obtained by polishing a silicon substrate material with the polishing composition of the present embodiment has few LPDs caused by coarse particles, such as foreign matters and aggregates, in the polishing composition and has high quality.

Second Embodiment

Next, there will be mainly described points in a second embodiment of the present invention different from those of the first embodiment. Steps before diluting an undiluted liquid in the second embodiment are different from the steps in the first embodiment.

A polishing composition according to the second embodiment is produced by a method including a raw material-filtering step, an undiluted liquid-preparing step, a diluting step, and a diluted liquid-filtering step.

In the raw material-filtering step, at least part of raw materials for the polishing composition are filtered. In the undiluted liquid-preparing step, the raw materials for the polishing composition at least part of which are filtered are mixed to prepare an undiluted liquid. In the diluting step, the undiluted liquid is diluted to obtain a diluted liquid. In the diluted liquid-filtering step, the diluted liquid is filtered. The polishing composition of the second embodiment is composed of a filtrate obtained in the diluted liquid-filtering step, i.e., the filtered diluted liquid.

The at least part of the raw materials filtered in the raw material-filtering step preferably include the part that is more likely to contain foreign matters or contains foreign matters in large amounts. The at least part of the raw materials are subjected to filtration, for example, in a liquid form such as a mixed liquid of water and a water-soluble polymer and an aqueous dispersion of abrasive grains. Besides this, the raw material-filtering step can be conducted in the same manner as in the undiluted liquid-filtering step described in the first embodiment.

The undiluted liquid-preparing step, in which the raw materials for the polishing composition at least part of which are filtered are mixed to prepare an undiluted liquid, can be conducted in the same manner as in the undiluted liquid-preparing step described in the first embodiment.

Since the foreign matters contained in the undiluted liquid are reduced in the raw material-filtering step, aggregates containing as cores the foreign matters in the undiluted liquid are less likely to be formed during the storage, transportation, or dilution of the undiluted liquid.

According to the second embodiment, the same effects as those described in the items (1) to (5) as the effects of the first embodiment are obtained. In the case of the first embodiment, the foreign matters contained in the entire undiluted liquid can be advantageously reduced. On the other hand, in the case of the second embodiment, the efficiency of filtration is easily enhanced, for example, by filtering only part of the raw materials being more likely to contain foreign matters.

Third Embodiment

Next, there will be mainly described points in a third embodiment of the present invention different from those of the first and second embodiments.

A polishing composition according to the third embodiment is produced by a method including a raw material-filtering step, an undiluted liquid-preparing step, an undiluted liquid-filtering step, a diluting step, and a diluted liquid-filtering step.

In the raw material-filtering step, at least part of raw materials for the polishing composition are filtered. In the undiluted liquid-preparing step, the raw materials for the polishing composition at least part of which are filtered are mixed to prepare an undiluted liquid. In the undiluted liquid-filtering step, the undiluted liquid is filtered. In the diluting step, the filtered undiluted liquid is diluted to obtain a diluted liquid. In the diluted liquid-filtering step, the diluted liquid is filtered. The polishing composition of the third embodiment is composed of a filtrate obtained in the diluted liquid-filtering step, i.e., the filtered diluted liquid.

According to the third embodiment, the same effects as those described in the items (1) to (5) as the effects of the first embodiment are obtained. In addition, the reducing effect of the aggregates before and after the diluted liquid-filtering step is expected to be synergistically exhibited by performing the raw material-filtering step and the undiluted liquid-filtering step.

The embodiments may be modified as follows.

The polishing composition may further contain a known additive such as a preservative agent and an antifungal agent as a raw material. Specific examples of preservative agents and antifungal agents include isothiazoline compounds, para-oxybenzoates, and phenoxyethanol.

The method for producing a polishing composition may further include adding a raw material being less likely to contain foreign matters or a raw material being less likely to be aggregated to the filtered undiluted liquid or the filtered diluted liquid, i.e., a filtrate obtained in the undiluted liquid-filtering step or a filtrate obtained in the diluted liquid-filtering step.

The raw material-filtering step, the undiluted liquid-filtering step, and the diluted liquid-filtering step each may be performed at one stage, or may be divided into and performed at plural stages. When the filtering step is divided into plural stages, the filters used in the stages may be the same. Alternatively, filters having different apertures or materials may be used at the stages. When filters having different apertures are used at the stages, the aperture of the filter to be used at the latter stage is preferably finer than that of the filter to be used at the former stage.

The raw material-filtering step, the undiluted liquid-filtering step, and the diluted liquid-filtering step may be performed by batch filtration, or may be performed by circulating filtration.

The abrasive grains may have a spherical shape or a non-spherical shape, such as a peanut shell shape having a constricted central portion, a spiky shape having a surface with projections, and a rugby ball shape.

The polishing pad used in polishing using the polishing composition is not particularly limited. The polishing pad may be of a nonwoven type or a suede type. The polishing pad may contain abrasive grains or may not contain abrasive grains.

The polishing composition may be of a one-pack type, or may be of a multi-pack type including two or more packs.

The polishing composition may be used to produce a polished product other than a silicon substrate, for example, a silicon oxide substrate, a plastic substrate, a glass substrate, and a quartz substrate. A high-quality polished product is easily obtained also in such a case, since the foreign matters and aggregates contained in the polishing composition are few. The raw materials for the polishing composition may be appropriately changed depending on a polished product to be produced by using the polishing composition. For example, the raw materials may contain resin particles.

The following are technical ideas capable of being grasped from the embodiments and modification described above.

A method for producing a polishing composition used for final polishing of a silicon substrate, comprising:

filtering an undiluted liquid containing abrasive grains, a water-soluble polymer, and water;

diluting the filtered undiluted liquid to obtain a diluted liquid; and filtering the diluted liquid, wherein said filtering the diluted liquid is performed in order to reduce the number of coarse particles contained in the polishing composition and having a size of 0.7 μm or more.

A polishing composition composed of a filtered diluted liquid that is obtained through:

filtering at least part of raw materials for the polishing composition;

preparing an undiluted liquid by mixing the raw materials at least part of which are filtered;

filtering the undiluted liquid;

diluting the filtered undiluted liquid to obtain a diluted liquid; and filtering the diluted liquid.

EXAMPLES

Next, the present invention will be more specifically described with reference to examples and comparative examples.

Nine percents by mass of colloidal silica having an average primary particle diameter of 35 nm, the average primary particle diameter obtained from the specific surface area measured by the BET method, 0.2% by mass of ammonia, 0.3% by mass of hydroxyethyl cellulose having a weight average molecular weight of 250,000, 0.17% by mass of polyvinyl pyrrolidone having a weight average molecular weight of 45,000, 0.01% by mass of a polyoxyethylene polyoxypropylene copolymer having a weight average molecular weight of 9,000, and 0.2% by mass of triammonium citrate were mixed with ion-exchange water to prepare an undiluted liquid for a polishing composition (undiluted liquid-preparing step). The undiluted liquid was filtered, and the filtered undiluted liquid was diluted to obtain a diluted liquid. The diluted liquid was then filtered to prepare polishing compositions of Examples 1 to 6 and Comparative Examples 1 to 3. More specifically, the undiluted liquid was filtered under the conditions described in Table 2 by using a filter having an aperture with a size described in the "A1" column of Table 1. As a result, the filtration rate values described in the "R1" column of Table 1 were obtained. For the dilution of the filtered undiluted liquid, the filtered undiluted liquid was diluted to 20 times by volume with pure water while the filtered undiluted liquid was stirred by using a homogenizer. The diluted liquid was filtered under the conditions described in Table 2 by using a filter having an aperture with a size described in the "A2" column of Table 1. As a result, the filtration rate values described in the "R2" column of Table 1 were obtained. The polishing composition of Comparative Example 1 was prepared without filtering the diluted liquid. The polishing composition of Comparative Example 2 was prepared without filtering the undiluted liquid. The polishing composition of Comparative Example 3 was prepared without filtering both the undiluted liquid and the diluted liquid.

The number of coarse particles contained in each polishing composition and having a size of 0.7 μm or more was measured. The number was measured by using AccuSizerFX, manufactured by Particle Sizing Systems. The results are shown in the "LPC (Large Particle Count)" column of Table 1.

The surface of silicon substrate material was polished under the conditions described in Table 3 with each of the polishing compositions. The silicon substrate materials used had a diameter of 300 mm, p-type conduction, a crystal orientation of <100>, and a resistivity of 0.1 Ω·cm or more and less than 100 Ω·cm. The silicon substrate materials were preliminarily polished with a polishing slurry (trade name: GLANZOX 1103) manufactured by Fujimi Incorporated. The number of particles existing on the surface of each of the polished silicon substrates and having a size of 37 nm or more was measured by using wafer inspection equipment Surfscan SP2, manufactured by KLA-Tencor Corporation. The results are shown in the "particles" column of Table 1.

The undiluted liquid used to prepare the polishing compositions of Examples 1 to 6 and Comparative Examples 1 to 3 was filtered under the conditions described in Table 2 by using a filter having an aperture of 0.2 μm. The filtered undiluted liquid was diluted to 20 times by volume with pure water while the filtered undiluted liquid was stirred by using a homogenizer. The obtained diluted liquid was subjected to suction filtration under a filtration difference pressure of 5 kPa by using each of disc filters having materials and structures described in the "filter material" column and "filter structure" column of Table 4, and having a diameter of 47 mm and an aperture of 0.45 μm. When the amount of the polishing composition passing through each filter before the filter was clogged after the suction filtration was started was more than 2 L, the filter life was evaluated as A. When the amount was 2 L or less, the filter life was evaluated as B. Results are shown in the "filter life" column of Table 4. The number of coarse particles contained in the filtrate obtained as a result of the suction filtration using each filter and having a size of 0.7 μm or more was measured by using AccuSizerFX, manufactured by Particle Sizing Systems. When the number of the coarse particles was less than 200 particles/mL, the filtration precision was evaluated as A. When the number was 200 particles/mL or more, the filtration precision was evaluated as B. Results are shown in the "filtration precision" column of Table 4.

TABLE 1

|  | Aperture | | | Filtration rate | | | | |
| --- | --- | --- | --- | --- | --- | --- | --- | --- |
|  | A1 [μm] | A2 [μm] | Ratio A2/A1 | R1 [mL/(minute·mm$^2$)] | R2 [mL/(minute·mm$^2$)] | Ratio R2/R1 | LPC [#/mL] | Particles |
| Example 1 | 0.2 | 0.2 | 1 | 0.02 | 0.018 | 0.9 | 87 | 30 |
| Example 2 | 0.2 | 5.0 | 25 | 0.02 | 0.69 | 35 | 853 | 65 |
| Example 3 | 0.2 | 1.0 | 5 | 0.02 | 0.38 | 19 | 419 | 52 |

TABLE 1-continued

|  | Aperture | | | Filtration rate | | | | |
| --- | --- | --- | --- | --- | --- | --- | --- | --- |
|  | A1 [μm] | A2 [μm] | Ratio A2/A1 | R1 [mL/(minute·mm$^2$)] | R2 [mL/(minute·mm$^2$)] | Ratio R2/R1 | LPC [#/mL] | Particles |
| Example 4 | 0.2 | 0.5 | 2.5 | 0.02 | 0.037 | 1.9 | 327 | 48 |
| Example 5 | 30.0 | 0.2 | 0.007 | 1.4 | 0.015 | 0.011 | 220 | 41 |
| Example 6 | 0.2 | 30.0 | 150 | 0.02 | 1.3 | 65 | 1360 | 75 |
| Comparative Example 1 | 0.2 | — | — | 0.02 | — | — | 2830 | 130 |
| Comparative Example 2 | — | 0.2 | — | — | 0.005 | — | 2100 | 80 |
| Comparative Example 3 | — | — | — | — | — | — | 4365 | 240 |

TABLE 2

| | |
| --- | --- |
| Filtration method: | Suction filtration |
| Suction pressure: | 50 kPa |
| Filtration time: | 5 minutes |
| Type of filter: | Cellulose mixed ester-type membrane filter manufactured by Toyo Roshi Kaisha, Ltd. |
| Filter diameter: | 47 mm |

TABLE 3

| | |
| --- | --- |
| Polishing machine: | Single wafer polishing machine (PNX-332B, manufactured by Okamoto Machine Tool Works, Ltd.) |
| Polishing load: | 15 kPa |
| Rotation speed of platen: | 30 rpm |
| Rotation speed of head: | 30 rpm |
| Polishing time: | 4 minutes |
| Temperature of polishing composition: | 20° C. |
| Feeding rate of polishing composition: | 0.5 L/minute (continuously fed without being circulated) |

TABLE 4

| Filter material | Filter structure | Filter life | Filtration precision |
| --- | --- | --- | --- |
| Nylon 66 | Single-layer porous | B | A |
| Polypropylene | Multilayered nonwoven | A | A |
| Polyether sulfone | Single-layer porous | B | A |
| Cellulose mixed ester | Single-layer porous | B | B |
| Cellulose acetate | Single-layer porous | B | B |

As shown in Table 1, the polishing compositions of Examples 1 to 6 had LPC measurement values lower than those of the polishing compositions of Comparative Examples 1 to 3. Furthermore, the measurement values of particles when the polishing compositions of Examples 1 to 6 were used were lower than those when the polishing compositions of Comparative Examples 1 to 3 were used. From these results, the polishing composition produced through both the filtration of the undiluted liquid and the filtration of the diluted liquid is found to be useful for producing a high-quality polished product on which the coarse particles in the polishing composition are less likely to remain.

From the results shown in Table 4, is found that better filtration precision is obtained by using the filter composed of nylon 66, polypropylene, or polyether sulfone, and that a filter life is also improved when the filter composed of polypropylene is used.

The invention claimed is:

1. A method for producing a polishing composition, comprising:
    preparing an undiluted liquid by mixing raw materials for the polishing composition, the raw materials including abrasive grains and a water-soluble polymer;
    filtering the undiluted liquid;
    diluting the filtered undiluted liquid to obtain a diluted liquid; and filtering the diluted liquid;
    wherein said filtering of the diluted liquid is performed by using a filter having an aperture of 0.05 μm or more and 5 μm or less.

2. The method according to claim 1, wherein said filtering of the diluted liquid is performed at a filtration rate of 0.010 mL/(minute·mm$^2$) or more and 0.69 mL/(minute·mm$^2$) or less at a suction pressure of 50 kPa.

3. A method for producing a polishing composition, comprising:
    filtering at least part of raw materials for the polishing composition, the raw materials including abrasive grains and a water-soluble polymer;
    preparing an undiluted liquid by mixing the raw materials at least part of which are filtered;
    diluting the undiluted liquid to obtain a diluted liquid; and filtering the diluted liquid;
    wherein said filtering of the diluted liquid is performed by using a filter having an aperture of 0.05 μm or more and 5 μm or less.

4. The method according to claim 3, wherein said filtering of the diluted liquid is performed at a filtration rate of 0.010 mL/(minute·mm$^2$) or more and 0.69 mL/(minute·mm$^2$) or less at a suction pressure of 50 kPa.

* * * * *